(12) United States Patent  
Song

(10) Patent No.: US 12,133,329 B2  
(45) Date of Patent: Oct. 29, 2024

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventor: Su Min Song, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 80 days.

(21) Appl. No.: 17/851,570

(22) Filed: Jun. 28, 2022

(65) Prior Publication Data

US 2023/0209710 A1 Jun. 29, 2023

(30) Foreign Application Priority Data

Dec. 29, 2021 (KR) .................... 10-2021-0190972

(51) Int. Cl.
*H05K 1/11* (2006.01)
*H05K 3/42* (2006.01)

(52) U.S. Cl.
CPC ............ *H05K 1/113* (2013.01); *H05K 3/429* (2013.01); *H05K 2201/096* (2013.01); *H05K 2201/09827* (2013.01); *H05K 2203/0554* (2013.01)

(58) Field of Classification Search
CPC ........ H05K 1/113; H05K 1/115; H05K 1/116; H05K 1/0206; H05K 2201/096; H05K 2201/0979; H05K 2201/09518; H05K 2201/09845; H05K 2201/09481; H05K 2201/09663; H05K 2201/09745; H05K 2201/09627; H05K 2201/09454; H01L 21/486

See application file for complete search history.

(56) References Cited

U.S. PATENT DOCUMENTS

| | | | | |
|---|---|---|---|---|
| 7,761,982 B2* | 7/2010 | Nagase | ............... | H01L 23/5389 29/830 |
| 2005/0136646 A1* | 6/2005 | Larnerd | ................. | H05K 3/429 174/250 |
| 2006/0186537 A1* | 8/2006 | Goto | ...................... | H05K 3/421 257/734 |
| 2011/0100686 A1* | 5/2011 | Ryoichi | ................. | H05K 3/421 174/257 |
| 2011/0132648 A1* | 6/2011 | Mutnury | ............. | H05K 1/0245 174/262 |
| 2015/0189751 A1* | 7/2015 | Akahoshi | ............. | H05K 3/4661 174/262 |

(Continued)

FOREIGN PATENT DOCUMENTS

| | | |
|---|---|---|
| JP | 2002-141668 A | 5/2002 |
| JP | 2004-104079 A | 4/2004 |

*Primary Examiner* — Roshn K Varghese
(74) *Attorney, Agent, or Firm* — Morgan, Lewis & Bockius LLP

(57) ABSTRACT

Provided are a printed circuit board and a method for manufacturing the same, the printed circuit board including: an insulating member; a first pad disposed in the insulating member; a plurality of first vias respectively disposed on a lower side of the first pad in the insulating member and connected to the first pad; and a second via disposed on an upper side of the first pad in the insulating member and connected to the first pad.

16 Claims, 7 Drawing Sheets

(56) References Cited

U.S. PATENT DOCUMENTS

| | | | | |
|---|---|---|---|---|
| 2016/0073515 A1* | 3/2016 | Shimizu | ................ | H05K 1/185 |
| | | | | 361/761 |
| 2016/0381781 A1* | 12/2016 | Park | ........................ | H05K 3/42 |
| | | | | 29/852 |
| 2022/0361330 A1* | 11/2022 | Oyaizu | ................ | H05K 1/113 |

* cited by examiner

I - I'

II-II'

III-III'

(12) United States Patent

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2021-0190972 filed on Dec. 29, 2021 in the Korean Intellectual Property Office, the disclosure of which is incorporated herein by reference in its entirety.

TECHNICAL FIELD

The present disclosure relates to a printed circuit board and a method for manufacturing the same.

BACKGROUND

In a multilayer printed circuit board, a via is formed to electrically connect wiring layers disposed on different layers. In general, the via is formed by processing an insulating material for forming a via hole using a laser device having a mask and then filling the via hole in a plating process. In a case in which the printed circuit board is configured to include more layers, it is inconvenient to repeat the via hole forming process and the plating process for each layer, and in this case, a problem of alignment may occur.

SUMMARY

An aspect of the present disclosure may provide a printed circuit board capable of reducing the number of processes for forming vias and a method for manufacturing the same.

Another aspect of the present disclosure may provide a printed circuit board capable of improving alignment between vias and a method for manufacturing the same.

Another aspect of the present disclosure may provide a printed circuit board capable of improving productivity in terms of vias and a method for manufacturing the same.

Another aspect of the present disclosure may provide a printed circuit board capable of securing via reliability and a method for manufacturing the same.

One of several solutions suggested in the present disclosure is to simultaneously form a plurality of first via holes and a second via hole for forming a plurality of first vias and a second via disposed on different layers through a single laser process using a via pad disposed therebetween to have a plurality of through-holes as a mask.

According to an aspect of the present disclosure, a printed circuit board may include: an insulating member; a first pad disposed in the insulating member; a plurality of first vias respectively disposed on a lower side of the first pad in the insulating member and connected to the first pad; and a second via disposed on an upper side of the first pad in the insulating member and connected to the first pad.

According to another aspect of the present disclosure, a method for manufacturing a printed circuit board may include: forming a first insulating layer; forming, in the first insulating layer, a first pad in which a plurality of through-holes are formed; forming a second insulating layer covering the first pad on the first insulating layer; forming a plurality of first via holes and a second via hole in the first and second insulating layers, respectively, the plurality of first via holes being connected to the plurality of through-holes, respectively, and the second via hole exposing the plurality of through-holes; and forming a plurality of first vias and a second via by filling the plurality of first via holes, the plurality of through-holes, and the second via hole through plating. In the forming of the plurality of first via holes and the second via hole, the first pad may be used as a laser processing mask for forming the plurality of first via holes.

According to another aspect of the present disclosure, a printed circuit board may include: an insulating member; an upper pad and a plurality lower pads disposed in the insulating member; a plurality of first vias, dispose in the insulating member, spaced apart from each other, and respectively extending from the plurality of lower pads; and a second via disposed in the insulating member and extending between the plurality of first vias and the upper pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
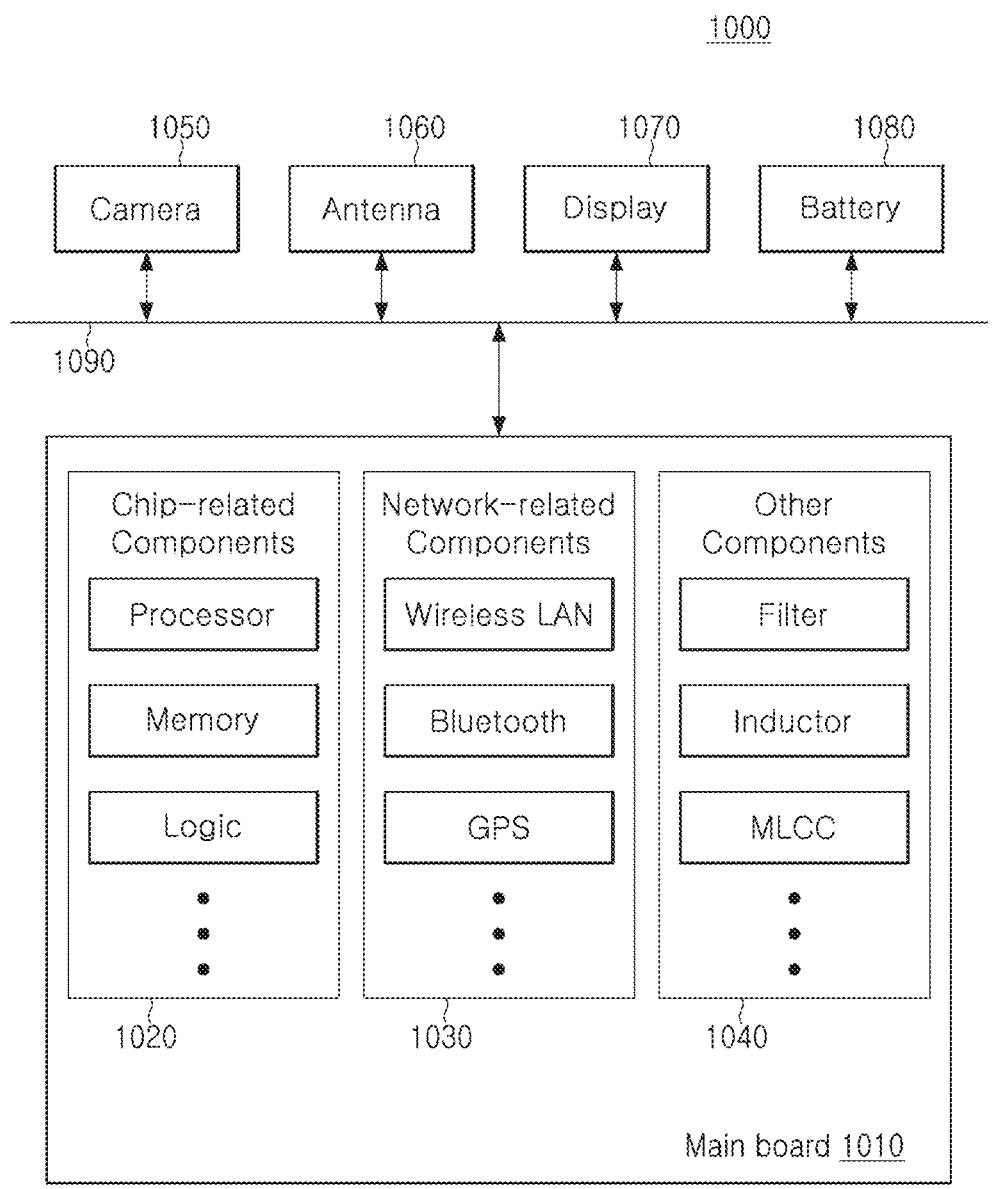
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, longterm evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
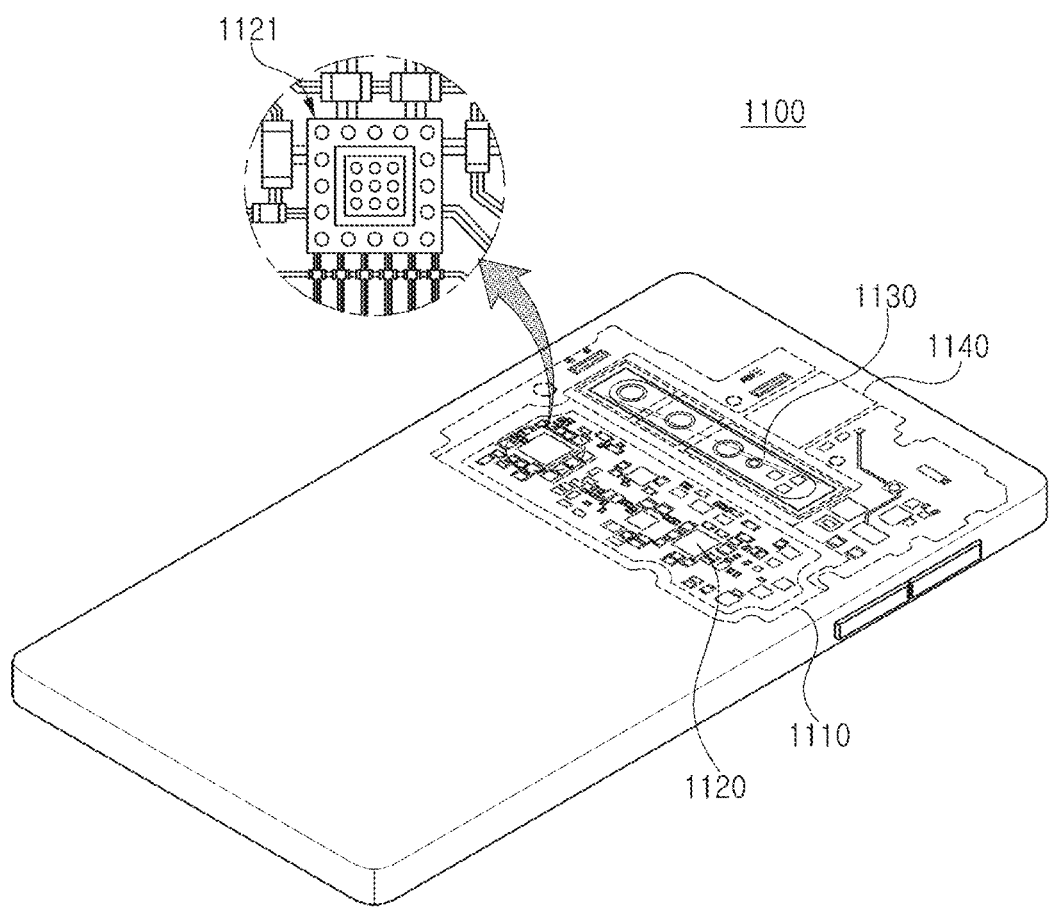
FIG. 2 is a schematic perspective view illustrating an example of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted, but is not limited thereto. Alternatively, the component package 1121 may be in the form of a printed circuit board in which active components and/or passive components are embedded. Meanwhile, the electronic device is not necessarily limited to the smartphone 1100, but may be any other electronic device as described above.

Printed Circuit Board

Figure 3:
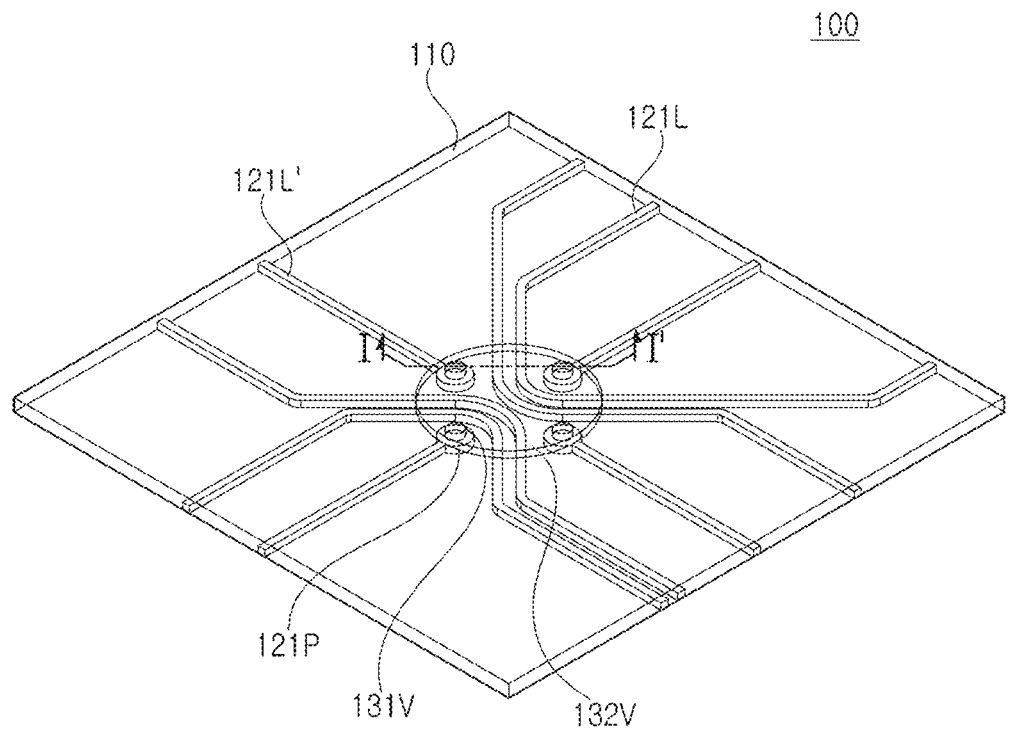
FIG. 3 is a schematic transparent perspective view illustrating an example of a printed circuit board.

FIG. 3 is a schematic transparent perspective view illustrating an example of a printed circuit board.

Figure 4:
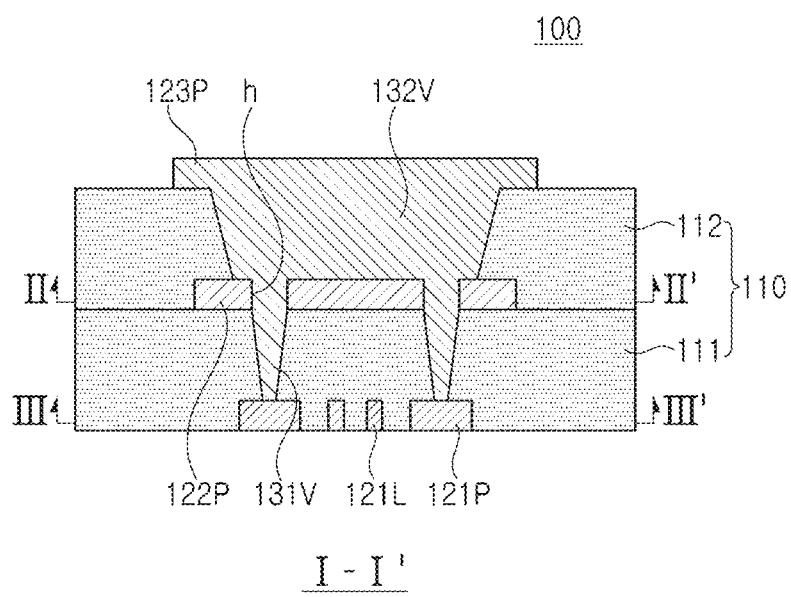
FIG. 4 is a schematic cross-sectional view of the printed circuit board taken along line I-I' of FIG. 3.

FIG. 4 is a schematic cross-sectional view of the printed circuit board taken along line I-I' of FIG. 3.

Figure 5:
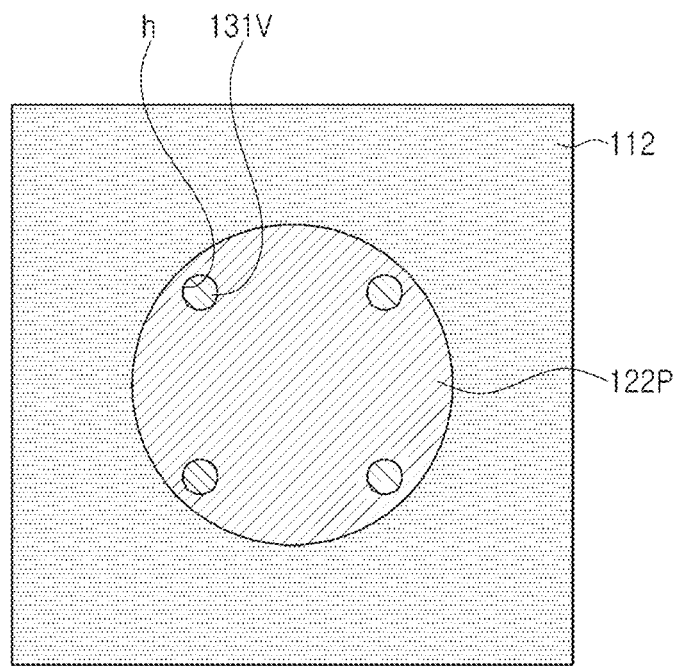
FIG. 5 is a schematic plan view of the printed circuit board taken along line II-II' of FIG. 4.

FIG. 5 is a schematic plan view of the printed circuit board taken along line II-II' of FIG. 4.

Figure 6:
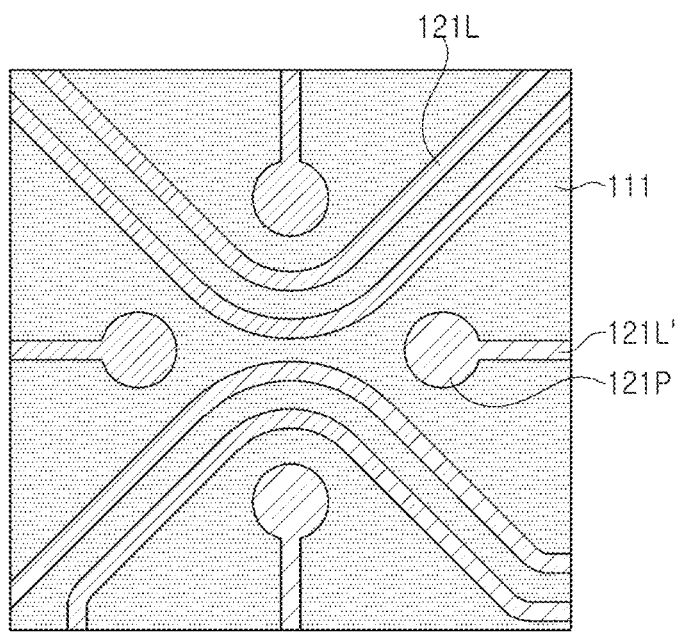
FIG. 6 is a schematic plan view of the printed circuit board taken along line III-III' of FIG. 4.

FIG. 6 is a schematic plan view of the printed circuit board taken along line III-III' of FIG. 4.

Meanwhile, in order to more clearly illustrate a plurality of first vias 131V to be described below and a second via 132V to be described below, a first pad 122P to be described below and a third pad 123P to be described below are omitted in FIG. 3.

Meanwhile, FIGS. 5 and 6 schematically illustrate cut plan views of respective layers of FIG. 4 on the basis of FIG. 3.

Referring to FIGS. 3 through 6, a printed circuit board 100 according to an exemplary embodiment may include: an insulating member 110; a first pad 122P disposed in the insulating member 110; a plurality of first vias 131V respectively disposed on a lower side of the first pad 122P in the insulating member 110 and connected to the first pad 122P; and a second via 132V disposed on an upper side of the first pad 122P in the insulating member 110 and connected to the first pad 122P.

Each of the plurality of first vias 131V may overlap the second via 132V, when viewed in a plan view. In addition, each of the plurality of first vias 131V may have a smaller dimension such as a diameter than the second via 132V. For example, the second via 132V having a large area on the upper side of the first pad 122P and the plurality of first vias 131V each having a small area on the lower side of the first pad 122P may be disposed to be connected to each other. Here, the dimension such as a diameter may refer to a largest dimension such as a diameter of each via when viewed from above, and may be measured using a scanning microscope or the like.

The first pad 122P may have a plurality of through-holes h, and the plurality of through-holes h may be filled with the plurality of first vias 131V, respectively. A wall surface of each of the plurality of through-holes h may provide a boundary between each of the plurality of first vias 131V and the first pad 122P. For example, each of the plurality of first vias 131V may penetrate through the first pad 122P to be connected to the second via 132V. In this case, each of the plurality of first vias 131V may be integrated with the second via 132V without a boundary therebetween. For example, the plurality of first vias 131V and the second via 132V may be formed together through the same plating process.

Unlike the conventional via process in which a via hole is formed by processing each layer through laser drilling, a plurality of via holes for forming the plurality of first vias 131V and a second via hole for forming the second via 132V in the printed circuit board 100 according to an exemplary embodiment may be formed together in a single laser process or the like using the first pad 122P having the plurality of through-holes h as an intermediate laser mask. Therefore, the number of processes can be reduced, and alignment between the vias can be improved. Furthermore, productivity in terms of the vias can be improved. In addition, since the plurality of first vias 131V, which are fine vias, are formed, it is possible to secure via reliability. For example, even if any one of the plurality of first vias 131V is broken or does not function properly, the problem can be solved by another of the plurality of first vias 131V. Thus, stability and the like can be secured.

Referring to FIGS. 3 through 6, the printed circuit board 100 according to an exemplary embodiment may further include: a plurality of second pads 121P disposed on lower sides of the plurality of first vias 131V, respectively, in the insulating member 110 and connected to the plurality of first vias 131V, respectively; one or more first lines 121L (such as conductive metal lines) disposed on substantially the same level as the plurality of second pads 121P in the insulating member 110 and passing between the plurality of second pads 121P, and/or at least one second line 121L' (such as conductive metal lines) disposed on substantially the same level as the plurality of second pads 121P in the insulating member 110 and connected to at least one of the plurality of second pads 121P.

Each of the plurality of second pads 121P may have a smaller area than the first pad 122P, when viewed in a plan view. For example, the plurality of second pads 121P may be used as stoppers of the plurality of via holes for forming the plurality of first vias 131V, respectively, and may be used as components for removing or cancelling noise of the one or more first lines 121L passing between the plurality of second pads 121P together with the plurality of first vias 131V. Each of the one or more first lines 121L may be a fine trace pattern. The number of one or more first lines 121L may preferably be two or more. Every two first vias of the plurality of first vias 131V may have the same function as a pair, and any two of the one or more first lines 121L as a pair may pass between a pair of first vias among the plurality of first vias 131V and a pair of second pads connected thereto among the plurality of second pads 121P, when viewed in a plan view. However, the one or more first lines 121L are not limited thereto, and only one of the one or more first lines 121L may pass between a pair of first vias among the plurality of first vias 131V and a pair of second pads connected thereto among the plurality of second pads 121P if necessary.

In the printed circuit board 100 according to an exemplary embodiment as described above, the first line 121L that is usable for signal transmission may pass between the plurality of first vias 131V and the plurality of second pads 121P that may include ground and/or dummy patterns when viewed in the plan view, and also, an upper side of the first line 121L may be covered with the second via 132V and the first pad 122 that may include ground and/or dummy patterns along a passage of the first line 121L, resulting in very good noise removal and/or cancellation effects.

Referring to FIGS. 3 through 6, the printed circuit board 100 according to an exemplary embodiment may further include a third pad 123P disposed on an upper side of the second via 132V on the insulating member 110 or on an upper side of the second via 132V in the insulating member 110 to be connected to the second via 132V.

The third pad 123P may be a land portion of the second via 132V, and thus may be integrated with the second via 132V without a boundary therebetween. The third pad 123P may be disposed on the insulating member 110, but may also be disposed in the insulating member 110 if necessary.

Hereinafter, components of the printed circuit board 100 according to an exemplary embodiment will be described in more detail with reference to FIGS. 3 through 6.

The insulating member 110 may include a plurality of insulating layers 111 and 112. For example, the insulating member 110 may include a first insulating layer 111 and a second insulating layer 112 disposed on the first insulating layer 111. However, the insulating member 110 is not limited thereto, and may include a larger number of insulating layers. The first and second insulating layers 111 and 112 may include an insulating material. The insulating material may include a thermosetting resin such as an epoxy resin, a thermoplastic resin such as a polyimide resin, or a material including an inorganic filler, an organic filler, and/or a glass fiber, glass cloth and/or glass fabric together with the thermosetting or thermoplastic resin. The insulating material may be a photosensitive material and/or a non-photosensitive material. For example, the applicable insulating material may be solder resist (SR), Ajinomoto build-up film (ABF), prepreg (PPG), resin coated copper (RCC), copper clad laminate (CCL), or the like, but is not limited thereto. As an insulating material, another type of polymer material is applicable.

Each of the first to third pads 122P, 121P, and 123P may include a metal material. The metal material may include copper (Cu), aluminum (Al), silver (Ag), tin (Sn), gold (Au), nickel (Ni), lead (Pb), titanium (Ti), and/or alloys thereof. Each of the first to third pads 122P, 121P, and 123P may perform various functions depending on design. For example, the first to third pads 122P, 121P, and 123P may be ground pads, power pads, or signal pads. Each of the first to third pads 122P, 121P, and 123P may be a ground pad, but is not limited thereto. Each of the first to third pads 122P, 121P, and 123P may include an electroless plating layer (or chemical copper) and an electrolytic plating layer (or electrical copper).

The first and third pads 122P and 123P may have a relatively large area when viewed in a plan view, and for example, may have a diameter of about 80 μm or more, e.g., about 80 μm to about 120 μm. The second pad 121P may have a relatively small area when viewed in a plan view, and for example, may have a diameter of about 30 μm or less, e.g., about 20 μm to about 30 μm. Here, the diameter may refer to a largest diameter of each pad when viewed from above, and may be measured using a scanning microscope or the like.

Each of the first and second vias 131V and 132V may include a metal material. The metal material may include copper (Cu), aluminum (Al), silver (Ag), tin (Sn), gold (Au), nickel (Ni), lead (Pb), titanium (Ti), and/or alloys thereof. Each of the first and second vias 131V and 132V may perform various functions depending on design. For example, the first and second vias 131V and 132V may be vias for signal connection, vias for ground connection, or vias for power connection. Each of the first and second vias 131V and 132V may be a via for ground connection, but is not limited thereto. Each of the first and second vias 131V and 132V may include an electroless plating layer (or chemical copper) and an electrolytic plating layer (or electrical copper).

Each of the first vias 131V may have a relatively small area when viewed in a plan view, and for example, may have a diameter of about 15 μm or less, e.g., about 5 μm to about 15 μm. The second via 132V may have a relatively large area when viewed in a plan view, and for example, may have a diameter of about 50 μm or more, e.g., about 50 μm to about 70 μm. Here, the diameter may refer to a largest diameter of each via when viewed from above, and may be measured using a scanning microscope or the like.

Each of the first and second lines 121L and 121L' may include a metal material. The metal material may include copper (Cu), aluminum (Al), silver (Ag), tin (Sn), gold (Au), nickel (Ni), lead (Pb), titanium (Ti), and/or alloys thereof. The first and second lines 121L and 121L' may perform various functions depending on how to design a layer concerned. For example, the first and second lines 121L and 121L' may be ground patterns, power patterns, or signal patterns. Here, the signal patterns may include various signals, e.g., data signals, other than ground patterns, power patterns, and the like. The first lines 121L may be signal patterns, and the second lines 121L' may be ground patterns, but the first lines 121L and the second lines 121L' are not limited thereto. Each of the first and second lines 121L and 121L' may include an electroless plating layer (or chemical copper) and an electrolytic plating layer (or electrical copper).

Each of the first and second lines 121L and 121L' may be a fine trace pattern, and for example, may have a line width of about 3 μm or less, e.g., about 1 μm to about 3 μm. Here, the line width may refer to a smallest line width when each line is viewed from above, and may be measured using a scanning microscope or the like. When at least two first lines 121L are formed as a pair, a space therebetween may be about 3 μm or less, e.g., about 1 μm to about 3 μm. When one or more first lines 121L pass between the plurality of second pads 121P, a space between each of the plurality of second pads 121P and each of the one or more first lines 121L may also be about 3 μm or less, e.g., about 1 μm to about 3 μm. Here, the space may refer to a smallest space between the line and the pad when viewed from above, and may be measured using a scanning microscope or the like.

FIGS. 7A through 7E are schematic cross-sectional views illustrating examples of processes for manufacturing the printed circuit board of FIG. 3.

Referring to FIGS. 7A through 7E, a method for manufacturing a printed circuit board according to an exemplary embodiment may include: forming a first insulating layer 111; forming a first pad 122P in which a plurality of through-holes h are formed on the first insulating layer 111; forming a second insulating layer 112 covering the first pad 122P on the first insulating layer 111; forming a plurality of first via holes V1 and a second via hole V2 in the first and second insulating layers 111 and 112, respectively, the plurality of first via holes V1 being connected to the plurality of through-holes h, respectively, and the second via hole V2 exposing the plurality of through-holes h; and forming a plurality of first vias 131V and a second via 132V by filling the plurality of first via holes V1, the plurality of through-holes h, and the second via hole V2 through plating. In the forming of the plurality of first via holes V1 and the second via hole V2, more specifically, at the time of forming the second via hole V2, the first pad 122P may be used as a laser processing mask for forming the plurality of first via holes V1.

In the forming of the plurality of first via holes V1 and the second via hole V2, the plurality of first via holes V1 and the second via hole V2 may be simultaneously formed through a single laser process. In the forming of the plurality of first vias 131V and the second via V2, the plurality of first vias 131V and the second via 132V may be formed together through the same plating process.

As described above, in the method for manufacturing a printed circuit board according to an exemplary embodiment, the plurality of first via holes V1 and the second via hole V2 may be formed together by a single laser process or the like, using the first pad 122P having the plurality of through-holes h as an intermediate laser mask. In addition, the plurality of first vias 131V and the second via 132V may be formed together through a single plating process. Therefore, the number of processes can be reduced, and alignment between the vias can be improved. Furthermore, productivity in terms of the vias can be improved. In addition, since the plurality of first vias 131V, which are fine vias, are formed, it is possible to secure via reliability. For example, even if any one of the plurality of first vias 131V is broken or does not function properly, the problem can be solved by another of the plurality of first vias 131V. Thus, stability and the like can be secured.

Hereinafter, each of the steps in the method for manufacturing a printed circuit board according to an exemplary embodiment will be described in more detail with reference to FIGS. 7A through 7E.

Figure 7A:
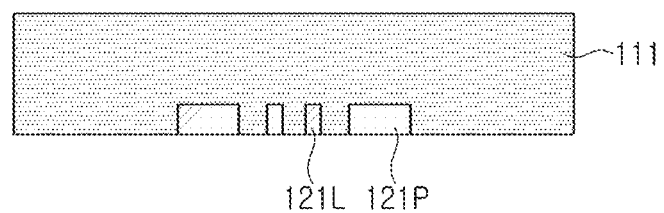
FIGS. 7A through 7E are schematic cross-sectional views illustrating examples of processes for manufacturing the printed circuit board of FIG. 3.

Referring to FIG. 7A, a plurality of second pads 121P may be formed, and a first insulating layer 111 may be formed to cover the plurality of second pads 121P. At the time of forming the plurality of second pads 121P, first and second lines 121L and 121L' may also be formed together. The plurality of second pads 121P and the first and second lines 121L and 121L' may be formed through a plating process using an additive process (AP), a semi AP (SAP), a modified SAP (MSAP), tenting (TT), or the like. Each of the plurality of second pads 121P and the first and second lines 121L and 121L' may be formed as an embedded pattern using a detach core. The first insulating layer 111 may be formed by stacking an uncured-state insulating film and then curing the insulating film.

Figure 7B:
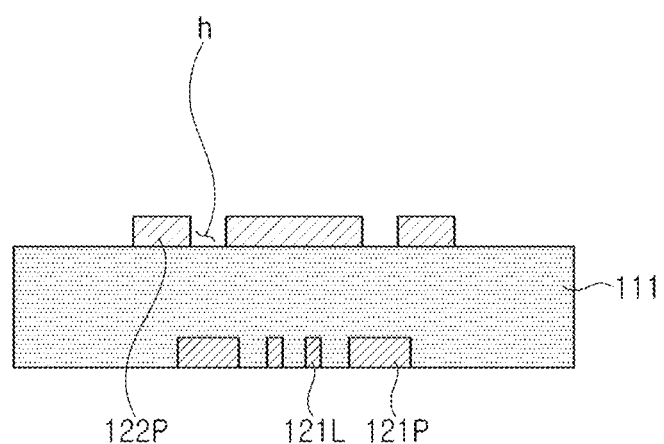

Referring to FIG. 7B, a first pad 122P may be formed on the first insulating layer 111. At the time of forming the first pad 122P, the first pad 122P may be patterned to have a plurality of through-holes h. The first pad 122P may be formed through a plating process using AP, SAP, MSAP, TT, or the like.

Figure 7C:
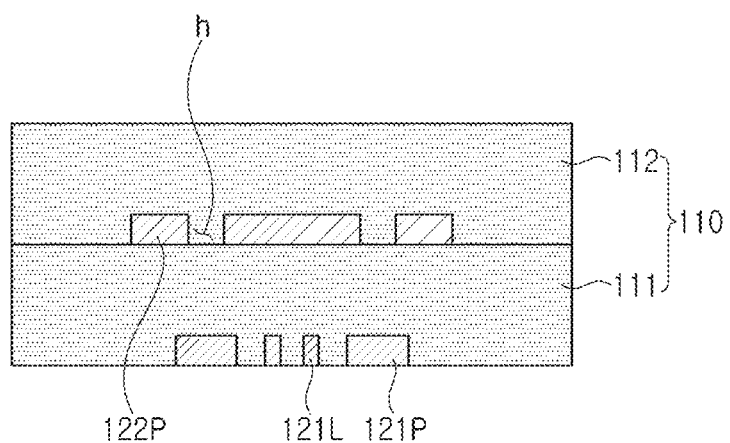

Referring to FIG. 7C, a second insulating layer 112 covering the first pad 122P may be formed on the first insulating layer 111. The second insulating layer 112 may be formed by stacking an uncured-state insulating film and then curing the insulating film.

Figure 7D:
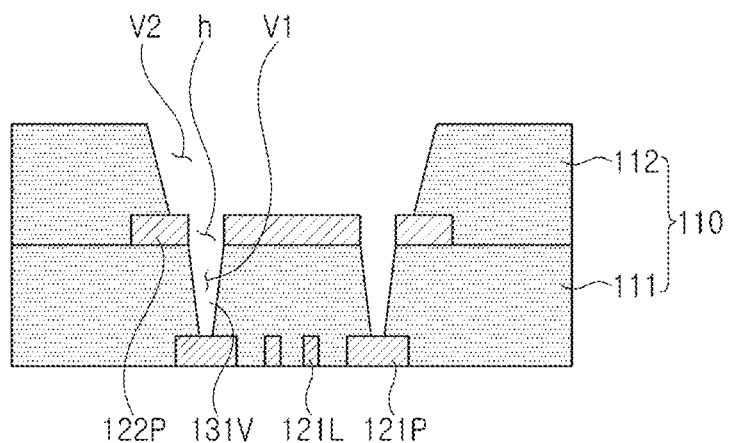

Referring to FIG. 7D, a plurality of first via holes V1 and a second via hole V2 may be formed in the first and second insulating layers 111 and 112, respectively. The plurality of first via holes V1 and the second via hole V2 may be simultaneously formed by laser processing. In this case, the first pad 122P having the plurality of through-holes h may be used as a laser processing mask for forming the plurality of first via holes V1.

Figure 7E:
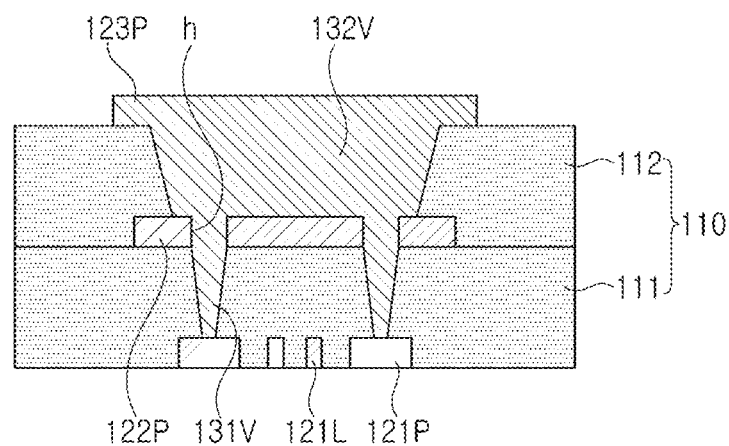

Referring to FIG. 7E, a plurality of first vias 131V and a second via 132V may be formed by filling the plurality of first via holes V1, the plurality of through-holes h, and the second via hole V2 through plating. The plurality of first vias 131V and the second via 132V may be simultaneously formed through a plating process using AP, SAP, MSAP, TT, or the like.

Through a series of processes, the printed circuit board 100 according to an exemplary embodiment described above may be manufactured. However, this is merely an example of a manufacturing method, and the printed circuit board 100 according to an exemplary embodiment described above may be manufactured by another manufacturing method.

Concerning the other details, the details described above for the printed circuit board 100 according to an exemplary embodiment may also be applicable to the method for manufacturing a printed circuit board according to an exemplary embodiment unless contradictory, and the overlapping description will be omitted.

Figure 8:
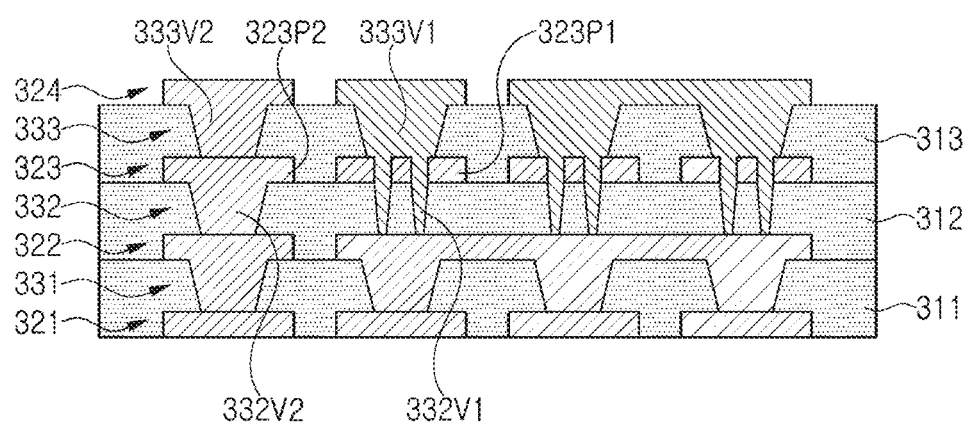
FIG. 8 is a schematic cross-sectional view illustrating another example of a printed circuit board.

FIG. 8 is a schematic cross-sectional view illustrating another example of a printed circuit board.

Referring to FIG. 8, a printed circuit board 300 according to another exemplary embodiment may be a multilayer substrate including first to third insulating layers 311, 312, and 313, first to fourth wiring layers 321, 322, 323, and 324, and first to third via layers 331, 332, and 333. More specifically, the printed circuit board 300 may be a multilayer coreless substrate. However, the printed circuit board 300 is not limited thereto, and may be modified into a multilayer core substrate in a symmetrical or asymmetrical form if necessary.

The second via layer 332 may include a plurality of first vias 332V1 each having a relatively small size and a second via 332V2 having a relatively large size. For example, each of the plurality of first vias 332V1 may have a smaller diameter than the second via 332V2. The diameter may refer to a largest diameter when the via is viewed from above, and may be measured using a scanning microscope or the like. The plurality of first vias 332V1 and the second via 332V2 may be disposed on substantially the same level.

Each of the plurality of first vias 332V1 may be integrated with a third via 333V1 of the third via layer 333 without a boundary therebetween by penetrating through a first pad 323P1 of the third wiring layer 323. For example, the plurality of first vias 332V1 may be fine vias as described above for the printed circuit board 100 according to an exemplary embodiment. The second via 332V2 may be a stack via disposed together with a fourth via 333V2 of the third via layer 333 in a stack form, with a second pad 323P2 of the third wiring layer 323 interposed therebetween.

In this way, in the printed circuit board 300 according to another exemplary embodiment, the fine vias described in detail above for the printed circuit board 100 according to an exemplary embodiment may be disposed together with a stack via, which is typically disposed in a multilayer substrate.

Hereinafter, components of the printed circuit board 300 according to another exemplary embodiment will be described in more detail with reference to FIG. 8.

The first to third insulating layers 311, 312, and 313 may include an insulating material. The insulating material may include a thermosetting resin such as an epoxy resin, a thermoplastic resin such as a polyimide resin, or a material including an inorganic filler, an organic filler, and/or a glass fiber, glass cloth and/or glass fabric together with the thermosetting or thermoplastic resin. The insulating material may be a photosensitive material and/or a non-photosensitive material. For example, the applicable insulating material may be solder resist (SR), Ajinomoto build-up film (ABF), prepreg (PPG), resin coated copper (RCC), copper clad laminate (CCL), or the like, but is not limited thereto. As an insulating material, another type of polymer material is applicable.

Each of the first to fourth wiring layers 321, 322, 323, and 324 may include a metal material. The metal material may include copper (Cu), aluminum (Al), silver (Ag), tin (Sn), gold (Au), nickel (Ni), lead (Pb), titanium (Ti), and/or alloys thereof. Each of the first to fourth wiring layers 321, 322, 323, and 324 may perform various functions depending on design. For example, the first to fourth wiring layers 321, 322, 323, and 324 may include ground patterns, power patterns, signal patterns, or the like. These patterns may include line patterns, pad patterns, or plane patterns. Each of the first to fourth wiring layers 321, 322, 323, and 324 may include an electroless plating layer (or chemical copper) and an electrolytic plating layer (or electrical copper).

Each of the first to third via layers 331, 332, and 333 may include a metal material. The metal material may include copper (Cu), aluminum (Al), silver (Ag), tin (Sn), gold (Au), nickel (Ni), lead (Pb), titanium (Ti), and/or alloys thereof. Each of the first to third via layers 331, 332, and 333 may perform various functions depending on design. For example, the first to third via layers 331, 332, and 333 may include vias for signal connection, vias for ground connection, vias for power connection, or the like. Each of the first to third via layers 331, 332, and 333 may include an electroless plating layer (or chemical copper) and an electrolytic plating layer (or electrical copper).

Concerning the other details, the details described above for the printed circuit board 100 according to an exemplary embodiment may also be applicable to the printed circuit board 300 according to another exemplary embodiment unless contradictory, and the overlapping description will be omitted.

As set forth above, as one effect of the present disclosure, it is possible to provide a printed circuit board capable of reducing the number of processes for forming vias and a method for manufacturing the same.

As another effect of the present disclosure, it is possible to provide a printed circuit board capable of improving alignment between vias and a method for manufacturing the same.

As another effect of the present disclosure, it is possible to provide a printed circuit board capable of improving productivity in terms of vias and a method for manufacturing the same.

As another effect of the present disclosure, it is possible to provide a printed circuit board capable of securing via reliability and a method for manufacturing the same.

While exemplary embodiments have been shown and described above, it will be apparent to those skilled in the art that modifications and variations could be made without departing from the scope of the present invention as defined by the appended claims.

What is claimed is:

1. A printed circuit board comprising:
   an insulating member;
   a first pad disposed in the insulating member;
   a plurality of first vias respectively disposed on a lower side of the first pad in the insulating member and connected to the first pad;
   a second via disposed on an upper side of the first pad in the insulating member and connected to the first pad;
   a plurality of second pads disposed on lower sides of the plurality of first vias in the insulating member and connected to the plurality of first vias; and
   one or more lines disposed on substantially the same level as the plurality of second pads in the insulating member and disposed between the plurality of second pads,
   wherein the first pad has one or more through-holes, and the plurality of first vias and the second via are integrated as one body through the one or more through-holes.

2. The printed circuit board of claim 1, wherein each of the plurality of first vias overlaps the second via, in a plan view of the printed circuit board.

3. The printed circuit board of claim 2, wherein each of the plurality of first vias has a smaller area than the second via.

4. The printed circuit board of claim 1, wherein the one or more through-holes are filled with the plurality of first vias, respectively.

5. The printed circuit board of claim 4, wherein a wall surface of each of the one or more through-holes provides a boundary between each of the plurality of first vias and the first pad.

6. The printed circuit board of claim 1, wherein each of the plurality of first vias is integrated with the second via without a boundary therebetween.

7. The printed circuit board of claim 1, wherein each of the plurality of second pads has a smaller area than the first pad, in a plan view of the printed circuit board.

8. The printed circuit board of claim 1, wherein the one or more lines include at least two lines, and
two of the one or more lines as a pair disposed between two of the plurality of first vias, in a plan view of the printed circuit board.

9. The printed circuit board of claim 1, wherein each of the first pad, the plurality of second pads, the plurality of first vias, and the second via includes a ground pattern, and
each of the one or more lines includes a signal pattern.

10. The printed circuit board of claim 1, further comprising a third pad disposed on an upper side of the second via on or in the insulating member and connected to the second via.

11. The printed circuit board of claim 1, further comprising a third via disposed on substantially the same level as the plurality of first vias in the insulating member, and
each of the plurality of first vias has a smaller area than the third via.

12. The printed circuit board of claim 1, wherein the plurality of second pads are spaced apart from each other, and
in a cross-sectional view of the printed circuit board, a portion of the insulating member is disposed in a region between two pads among the plurality of second pads.

13. A printed circuit board comprising:
an insulating member;
a first pad disposed in the insulating member;
a plurality of first vias, disposed in the insulating member, spaced apart from each other, and respectively disposed partially in and extending from the first pad;
a second via disposed in the insulating member and extending from the first pad and also from the plurality of first vias in a direction away from the plurality of first vias;
a plurality of second pads disposed on lower sides of the plurality of first vias in the insulating member and connected to the plurality of first vias; and
one or more metal lines disposed on substantially the same level as the plurality of second pads in the insulating member and disposed between the plurality of second pads,
wherein one of the plurality of first vias and the first pad have a boundary therebetween.

14. The printed circuit board of claim 13, wherein the one of the plurality of first vias is integrated with the second via without a boundary therebetween.

15. The printed circuit board of claim 13, wherein in a plan view of the printed circuit board, the one or more metal lines include two metal lines disposed between two of the plurality of first vias.

16. The printed circuit board of claim 13, further comprising a third via disposed on substantially the same level as the plurality of first vias in the insulating member, and
each of the plurality of first vias has a smaller area than the third via.

* * * * *